US011721775B2

(12) United States Patent
Van Duijnhoven et al.

(10) Patent No.: US 11,721,775 B2
(45) Date of Patent: Aug. 8, 2023

(54) BACK-SHEET COMPRISING POLYBUTYLENE TEREPHTALATE

(71) Applicant: ENDURANCE SOLAR SOLUTIONS B.V., Geleen (NL)

(72) Inventors: Franciscus Gerardus Henricus Van Duijnhoven, Echt (NL); Robert Hendrik Catharina Janssen, Echt (NL); Pieter Gijsman, Echt (NL); Mark Martinus Maria Janssen, Echt (NL)

(73) Assignee: ENDURANCE SOLAR SOLUTIONS B.V., Geleen (NL)

( * ) Notice: Subject to any disclaimer, the term of this patent is extended or adjusted under 35 U.S.C. 154(b) by 0 days.

(21) Appl. No.: 16/982,117

(22) PCT Filed: Mar. 28, 2019

(86) PCT No.: PCT/EP2019/057943
§ 371 (c)(1),
(2) Date: Sep. 18, 2020

(87) PCT Pub. No.: WO2019/185842
PCT Pub. Date: Oct. 3, 2019

(65) Prior Publication Data
US 2021/0013351 A1  Jan. 14, 2021

(30) Foreign Application Priority Data
Mar. 28, 2018  (EP) ..................................... 18164477

(51) Int. Cl.
*H01L 31/049* (2014.01)
*B32B 27/08* (2006.01)
(Continued)

(52) U.S. Cl.
CPC ............ *H01L 31/049* (2014.12); *B32B 27/08* (2013.01); *B32B 27/18* (2013.01); *B32B 27/32* (2013.01);
(Continued)

(58) Field of Classification Search
CPC ....... H01L 31/049; B32B 27/08; B32B 27/18; B32B 27/32
See application file for complete search history.

(56) References Cited

U.S. PATENT DOCUMENTS

| 2013/0104959 A1 | 5/2013 | Natarajan et al. |
| 2014/0034113 A1* | 2/2014 | Xavier .................. H01L 31/049 136/251 |

FOREIGN PATENT DOCUMENTS

| CN | 1914273 | 2/2007 |
| CN | 102738275 | 10/2012 |

(Continued)

OTHER PUBLICATIONS

"Joncryl functional additives—Joncryl ADR 4400", Joncryl, [online], [retrieved on Mar. 17, 2022]. Retrieved from the Internet:<URL: http://www.nanozon.cn/UpLoadFile/file/20180910/6367219601961535158164833.pdf>, pp. 1-6. (Year: 2014).*

(Continued)

*Primary Examiner* — Tae-Sik Kang
(74) *Attorney, Agent, or Firm* — Nixon & Vanderhye P.C.

(57) ABSTRACT

The present invention relates to a back-sheet comprising a weatherable layer, a structural layer and a functional layer whereby one of the layers comprises polybutylene terephthalate and one or both of the other layers comprises a polyolefin. The layer comprising polybutylene terephthalate preferably further comprises an impact modifier. The impact modifier comprises an elastomer that contains functional groups that bond chemically and/or interact physically with (Continued)

the polybutylene terephthalate and wherein the elastomer constitutes the dispersed phase at a concentration of 1-49 Vol %. Preferably the elastomer contains epoxy functional groups. The polyolefin is selected from the group consisting of polyethylene homo or copolymers, polypropylene homo or (block-)copolymers, cyclic olefin copolymers, polymethylpentene, a thermoplastic polyolefine (TPO), or blends thereof.

14 Claims, 2 Drawing Sheets

(51) Int. Cl.
  *B32B 27/18* (2006.01)
  *B32B 27/32* (2006.01)
  *B32B 27/36* (2006.01)
(52) U.S. Cl.
  CPC ........ *B32B 27/36* (2013.01); *B32B 2307/714* (2013.01); *B32B 2323/10* (2013.01); *B32B 2367/00* (2013.01); *B32B 2457/12* (2013.01)

(56) References Cited

FOREIGN PATENT DOCUMENTS

| CN | 104356613 | 4/2016 | |
|---|---|---|---|
| CN | 205498231 U | 8/2016 | |
| JP | 2014/091973 | 5/2014 | |
| TW | I247766 B | 1/2006 | |
| WO | WO 2005/073316 | 8/2005 | |
| WO | 2013/156319 | 10/2013 | |
| WO | 2014/091973 | 6/2014 | |
| WO | 2018/087366 | 5/2018 | |
| WO | WO-2018087366 A1 * | 5/2018 | ............. B32B 25/08 |

OTHER PUBLICATIONS

International Search Report for PCT/EP2019/057943 dated Apr. 30, 2019, 4 pages.
Written Opinion of the ISA for PCT/EP2019/057943 dated Apr. 30, 2019, 9 pages.
*Impact modifiers: howto make your compound tougher*, Plastics Additives & Compounding, ISSN 1464-39, May/Jun. 2004.
Xiang Lu et al., *Morphology and Properties of PBT/SEBS and PBT-SEBS-G-MAH Blends*, Proceedings of PPS-31, AIP Conf. Proc. 1713, 2016.
Wang Guojian, "*Multicomponent Polymers—Principle, Structure and Properties*", 1$^{st}$. edition, pp. 249-250, Tongji University Press, Oct. 31, 2013.
Kong Ziming, "*Latest New Application of New Technology in Production of Engineering Materials and Development of New Products and Practical Encyclopedia of Industrial Technical Standards, Rubber and Plastics Volume*", 1$^{st}$ edition, pp. 340-343, Xueyuan Audiovisual Press, Nov. 30, 2004.

\* cited by examiner

BACK-SHEET COMPRISING POLYBUTYLENE TEREPHTALATE

CROSS-REFERENCE TO RELATED APPLICATIONS

This application is the U.S. national phase of International Application No. PCT/EP2019/057943 filed Mar. 28, 2019 which designated the U.S. and claims priority to European Application No. 18164477.4 filed Mar. 28, 2018, the entire contents of each of which are hereby incorporated by reference.

FIELD

The present invention relates to a multi-layered film, a back-sheet for photovoltaic modules, comprising a polybutylene terephthalate layer. The invention further relates to a photovoltaic module comprising the back-sheet.

BACKGROUND AND SUMMARY

Recently, much attention has been paid to renewable and clean energy because of global environmental problems and exhaustion of fossil fuels. Among these, solar energy has attracted attention as a representative pollution-free energy source which can solve the problems of environmental contamination and exhaustion of fossil fuels.

Photovoltaic modules serve for electrical power generation from sunlight and consist of a laminate which comprises a solar cell system as the core layer. To form a photovoltaic module, solar cells grouped in series through appropriate electrical conductors called "ribbons", are typically encapsulated by an encapsulating material such as for example polyethylene (PE) with a high content of vinyl acetate, commonly known as EVA. The encapsulating material enclosing the solar cells serves as protection against mechanical and weathering-related influences. The core layer is present between a surface layer and a base layer or back-sheet, to complete the photovoltaic module. The surface layer, or main surface of the module, typically made of glass, covers the surface of the module exposed to the sun and allows the solar light to reach the cells. The base layer or back-sheet carries out a multiplicity of tasks. It guarantees protection of the encapsulating material and the solar cells from environmental influences, while simultaneously preventing the electrical connections from oxidizing. Typically, the back-sheet prevents moisture, oxygen and other factors depending on the atmospheric conditions from damaging the encapsulating material, the solar cells and the electrical connections. The back-sheet also provides for electrical insulation for the cells and the corresponding electrical circuits.

The solar cells, which are usually semiconductor materials that may be fragile, are typically encapsulated in polymeric materials that protect them from physical shocks and scratches. The encapsulated solar cells are generally further protected by glass or by another outer layer that is resistant to weathering, abrasion, or other physical insults.

The dominating encapsulation material for PV cells is chemically cross-linked EVA copolymer. The major drawback of EVA is the formation of corrosive degradation products like acetic acid. Acetic acid, which is formed during hydrolytic elimination of EVA, is linked to several PV module failure mechanisms like corrosion of interconnectors or cell metallization. Especially the metal core of the interconnector ribbons is prone to corrosion, which leads to slowly dying cells, as seen with electroluminescense measurements, upon Damp Heat (DH) ageing or combined DH/UV-ageing (G. Oretski et al, Polymer testing 60 (2017) 374-380; A. Masuda et al., J. Appl. Phys. 54, 04DR04 (2015)).

Generally, a back-sheet having a good weather resistance and durability, is used for the photovoltaic modules to protect the photovoltaic cell during long-term exposure to the external environments. The back-sheet is a photovoltaic laminate that protects the PV module from UV, moisture and weather while acting as an electrical insulator. The back-sheet often comprises several polymeric layers to provide the above-mentioned properties and to minimize deterioration in the long-term performance of solar cell modules. Several polymeric layers have their own function in the back-sheet. Normally a back-sheet comprises a functional layer facing the cells and encapsulant, a structural reinforcement layer or core layer, a weather-resistant layer or the layer at the air side and adhesive layers in between the functional and core layer and in between the core and weatherable layer.

Back-sheets comprising polybutylene terephthalate are known in the art. In for example US2013104959 a back-sheet is disclosed comprising layers of polymeric material, such as polyester films combined with fluoropolymers. Suitable polyesters include polyethylene terephthalate (PET), polytrimethylene terephthalate or polybutylene terephthalate (PBT).

It is known that fluor-containing polymers typically display a very low water vapor transmission rate (WVTR) due to their apolar nature. One would guess that this is the reason behind the very good damp heat performance of fluor-containing back-sheets. The presence of fluor-containing polymers is however a disadvantage because fluor-containing polymers are known as environmental unfriendly and they may cause toxic (HF) gasses when caught in a fire.

It is moreover known that most back-sheets still suffer from stability, hydrolytic stability, UV-stability and poor mechanical performance. The poor mechanical performance is often due to delamination of the polymer layers. When such a back-sheets are applied in PV modules this will lead to accelerated damp heat ageing which results in a reduced power output decay upon lifetime.

There is thus a continuous demand for back-sheets with improved durability, weather resistance and corrosion resistance, which can be produced at lower production costs whereby the productivity and quality of the photovoltaic module can be improved.

The object of the present invention is to provide a back-sheet with improved corrosion resistance.

Another object of the present invention is to provide a back-sheet with improved durability.

It is a further object of the present invention to provide a back-sheet. increased hydrolytic and thermal stability.

The objects of the present invention have been achieved in that a back-sheet is provided comprising a weatherable layer, a structural layer and a functional layer whereby one of the layers comprises an impact modified polybutylene terephthalate and one or both other layers comprise a polyolefin.

A weatherable layer as defined in the present invention means the air side layer of the back-sheet. The structural layer according to the present invention means the core layer of the back-sheet. The functional layer according to the present invention means the back-sheet layer facing the cells or encapsulant.

It has surprisingly been found that the back-sheet of the present invention has an increased acetic acid (AA) permeation which leads to improved corrosion resistance. A further advantage is that the back-sheet shows better durability leading to improved damp heat ageing which results in a better power output decay upon lifetime. Moreover, the back-sheet shows an increased hydrolytic stability.

BRIEF DESCRIPTION OF THE DRAIwINGS

DETAILED DESCRIPTION

Figure 1:
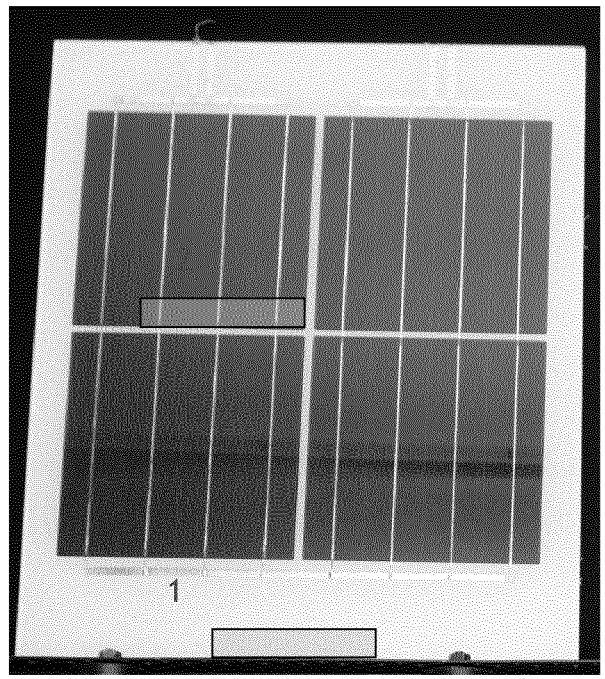
FIG. 1 is a photograph of a PV-module with pieces of the back-sheet removed from the backside thereof according to Example 1.

The back-sheet as used in the present invention comprises an impact modified polybutylene terephthalate layer either as weatherable layer or as structural layer. Preferably the weatherable layer comprises impact modified polybutylene terephthalate The impact modifier comprises an elastomer that contains functional groups that bond chemically and/or interact physically with the polybutylene terephthalate and wherein the elastomer constitutes a dispersed phase at a concentration of 1-49 Vol %, preferably a concentration of 5-30 Vol %.

The elastomer as mentioned herein means an elastomer chosen from the group consisting of polyether's, ethylene-propylene elastomers such as EPDM, ethylene-alpha olefin elastomers such as ethylene-octene elastomers, styrene-butadiene elastomers such as SBS or SEBS. The amount of functional groups that bond chemically and/or interact physically with the polybutylene terephthalate is preferably from 0.01 to 5 wt. %. (based on the total weight of the impact modified PBT). Preferred elastomer is an ethylene-alpha olefin elastomer Functional groups can be introduced in the elastomer in many ways. Preferred ways are by chemical modification of the elastomer or by graft polymerization of the elastomer with components containing functional groups as defined hereinabove. Non-limiting and preferred examples of such functional groups are unsaturated dicarboxylic acid anhydrides or an unsaturated dicarboxylic acid or an ester thereof, for instance maleic anhydride, maleic acid, fumaric acid, itaconic acid and itaconic anhydride; unsaturated epoxide such as glycidyl acrylate, for example glycidyl methacrylate; and unsaturated silanes such as for example vinyltrimethoxysilane, vinyltriethoxysilane, vinyltris(beta-methoxyethoxy)silane, gamma-methacryloxypropyltrimethoxysilane, vinyltriacetoxysilane, gamma-glycidoxypropyltrimethoxysilane, gamma-glycidoxypropyltriethoxysilane, beta-(3,4-epoxycyclohexyl)ethyltrimethoxysilane, vinyltrichlorosilane or mixtures of two or more thereof. Preferred functional groups are unsaturated dicarboxylic acid anhydrides.

In the context of the present invention polybutylene terephthalate resin (further herein referred to as PBT) is understood to be the condensation product of diols consisting essentially of butanediol and diacids consisting essentially of terephthalic acid. Such a PBT resin is obtainable by direct esterification of butanediol and terephthalic acid or by transesterification of butanediol with the dimethyl ester of terephthalic acid, thus comprising the esterified residues of butanediol and terephthalic acid.

The PBT may optionally be a copolymer comprising other components next to the esterified residues of butanediol and terephthalic acid, such as the esterified residues of other diols and dicarboxylic acids, as well as small amounts of polyfunctional alcohols or carboxylic acids.

Suitable diols that may be comprised in the PBT, are, for example, ethylene glycol, diethylene glycol, propylene glycol, 2,3-pentanediol, neopentylglycol, hexamethylene glycol, and cyclohexanedimethanol.

Suitable dicarboxylic acids are, for example, orthophthalic acid, isophthalic acid, naphthalene dicarboxylic acid, adipic acid, sebacic acid, and succinic acid.

Suitable polyfunctional carboxylic acids that can be used here are, for example, trifunctional carboxylic acids (such as trimesic acid and trimellitic acid) and tetrafunctional carboxylic acids (such as pyromellitic acid).

Suitable polyfunctional alcohols are, for example, triols (such as glycerol, trimethylol ethane, and trimethylol propane), and tetrols (such as pentaerythritol). Generally, the polyfunctional compounds, if any, are used in very low amounts to give the PBT a little degree of branching.

The PBT in the composition according to the invention preferably comprises the other components in an amount of at most 5wt %, preferably at most 1wt %, even more preferably less than 0.5wt %, relative to the weight of the PBT. Most preferably no other components are present.

The thickness of the back-sheet is preferably from 0.1 to 1 mm, more preferably from 0.1 to 0.8 mm, even more preferably from 0.1 to 0.75 mm.

The back-sheet of the present invention further comprises a weatherable or structural layer comprising a polyolefin. Preferably the structural layer comprises a polyolefin. The polyolefin is preferably selected from the group consisting of polyethylene homo or copolymers, or polypropylene homo or (block-)copolymers or blends thereof. The polyolefin layer may also be selected from a cyclic olefin copolymer, polymethylpentene, a thermoplastic polyolefin (TPO) or blends thereof.

The TPO may comprise the following polymers or blends thereof:
 a) A flexible polypropylene (FPP) being a mechanical or a reactor blend of PP resins (homo or copolymer) with EPR rubber (ethylene propylene rubber), like Hifax CA 10 A, Hifax CA 12, Hifax CA7441A, supplied by LyondellBasell, a mechanical FPP blend of PP resins with elastomer PP resins (like supplied by Dow under the trade name Versify 2300.01 or 2400.01), a mechanical FPP blend of PP (preferably random copolymer of propylene (RCP) with ethylene and possibly other olefins) with LLDPE (linear low densitiy polyethylene) or VLDPE (very low density polyethylene) or plastomers (like Exact 0201 or Exact 8201 supplied by Dexplastomers).
 b) FPP blends of PP blocks polymerized with PE blocks,
 c) Olefin block copolymers (OBC) resins of crystalline PE parts (blocks) and amorphous copolymerized PE parts (blocks) providing softness and high DSC melting temperature (plus or minus 120 degrees C.), like INFUSE™ olefin block copolymers supplied by Dow
 d) Polyethylene plastomers (VLDPE) or LLDPE, i.e. PE obtained by copolymerization of ethylene with short-chain alpha-olefins (for example, 1-butene, 1-hexene and 1-octene), with a density of less than 925 kg/m$^3$ (ISO 1183), possibly (partially) crosslinked to improve heat distortion temperature and flow during lamination of PV modules and possibly with addition of softener resin, like SEBS (e.g. Kraton G1657), EPR resin, EPDM resin, etc.

e) Thermoplastic vulcanisates blends based on blends of PP or PE with EPDM rubber, like Santoprene base blends, blends with PP are an FPP.

Preferably the structural layer comprises a polypropylene homo or (block-)copolymer or blends thereof.

The functional layer in the back-sheet of the present invention preferably comprises a polyolefin or functionalized polyolefin such as polyethylene or polypropylene homo-and copolymers or functionalized polyethylene-or polypropylene homo-or copolymers. Examples of functionalized polyethylene-or polypropylene copolymers are ethylene or propylene copolymerized with polar co-monomers chosen from maleic acid anhydride, vinyl acetate, acrylic and methacrylic ester such as methylacrylate, ethylacrylate, butylacrylate or ethylhexylacrylate, glycidyl (meth)acrylate), acrylic acid, methacrylic acids or maleic anhydride (MAH). A preferred functionalized polyolefin is a copolymer of ethylene with methylacrylate (EMA).

More preferably the functional layer comprises a polyolefin blend comprising a functionalized polyolefin as described in previous paragraph and a high crystalline polymer with a melting point above 150° C.

The high crystalline polymer is preferably selected from the group consisting of polyolefins, polyamides, or polyesters.

By the term "high crystallinity" it is understood that the polymer has a crystallinity greater than about 50 percent. More preferably, the crystallinity of the polymer ranges from 60 percent to 90 percent.

Examples of high crystalline polyolefins are for example polyethylene, polypropylene and/or polybutylene, with polypropylene being the most preferred.

In case of high crystalline polypropylene, the polymer comprises propylene as the main monomer unit. Included in this group are high crystalline polypropylene homopolymers and high crystalline polypropylene polymers containing 2 percent by weight or less of alpha-olefins, such as ethylene and butene-1. The alpha-olefins contained in the high crystalline polypropylene polymers may be of two or more kinds in combination. These polypropylenes may be obtained using either Zieger-Natta or metallocene catalysts.

Regardless of how the degree of crystallinity of the high crystalline polypropylene is measured, it is the polymers' properties that will determine whether a given polymer is "high crystalline" as the term is used herein. The first property is melting point. In cases where the high crystalline polypropylenes are prepared using a Ziegler-Natta catalyst, they may have a melting point above 150 degrees centigrade. Preferably, the melting point is between 150 degrees centigrade to 170 degrees centigrade. The second determining property is heat of fusion. When the polypropylenes are Ziegler-Natta derived polymers, they may have a heat of fusion of at least 100 Joules/g, at least 115 Joules/g or at least 120 Joules/g. Heat of fusion is determined using a differential scanning calorimeter and a method such as is described in ASTM D-3417-99 wherein a 5 to 10 mg sample is heated and cooled at a rate of 10 degrees centigrade.

If the high crystalline polypropylenes are obtained using a metallocene catalyst, the polypropylenes will have a melting point of at least about 158 degrees centigrade and a heat of fusion of at least 90 Joules/g. As for Ziegler-Natta derived polypropylenes, the crystalline properties of the metallocene catalyzed polypropylenes may also be assessed using a differential scanning calorimeter. Any metallocene derived polypropylene having these properties is a high crystalline polypropylene as the term is used herein. Examples of high crystalline polypropylenes useful in the present invention are 3270 9119 from ATOFINA™, BP™ Accpro 9346, BASELLADSTIF™ HA722J, and SUNOCO™ PPF-050-HC.

The functional layer preferably comprises at least 15 wt % of the high crystalline polymer based on the total weight of the polymers in the functional layer.

The functional layer but also the weatherable and structural layer may further comprise inorganic fillers and/or durability enlarging additives. Examples of these inorganic fillers are titanium oxide, calcium carbonate, barium sulfate, mica, talc, kaolin, glass microbeads and glass fibers. Example of durability enlarging additives are antioxidants such as primary and secondary antioxidants, UV stabilizers such as UV absorbers and hindered amine light stabilizers (HALS), thermal stabilizers and/or hydrolysis stabilizers.

Examples of primary antioxidants are phenolic antioxidants such as: Benzenepropanoic acid, 3,5-bis(1, 1-dimethylethyl)-4-hydroxy-octadecyl ester-2-Propyleneacid, 2-isopentane 6[(3-isopentane-2-hydroxy-5-isopentanephenyl)-ethyl]-4-isopentanephenylester, 2-Propenoic acid, 2-(1,1-dimethylethyl)-6-[[3-1, 1-dimethylethyl)-2-hydroxy-5-methylphenyl]methyl]-4-methylphenylester, di-ethyl-ester of 3,5-di-t-butyl-4-hydroxy-benzyl-phosphoric acid, 2,5,7, 8-Tetra-methyl-2-(4', 8', 12'-tri-methyl-tri-decyl)-chroman-6-ol, benzenepropanoic acid, 3,5-bis(1, 1-dimethylethyl)-4-hydroxy-, isooctyl ester, benzenepropionic acid, 3,5-bis (1,1-dimethylethyl)-4-hydroxy, isotridecyl ester, benzenepropanoic acid, 3,5-bis(1, 1-dimethylethyl)-4-hydroxy-(C13-C15)-branched and linear alkyl esters, 2,2 -methylenebis (6-t-butyl-4-methylphenol), 2,2 -methylenebis (4-ethyl-6-t-butylphenol), 2,2 -methylenebis 6-(1-methylcyclohexyl)-p-cresol, 4,4 -Butylidenebis (6-t-butyl-3-methyl-phenol), 2,2 -Ethylidenebis (4,6-di-t-butylphenol), phenol, 4,4'-methylenebis[2, 6-bis(1, 1-dimethylethyl)-~2,2 -Isobutylidenebis (4,6-dimethylphenol), N,N-Hexamethylene bis (3,5-di-t-butyl-4-hydroxyhydrocinnamamide), 3,9-Bis(1,1-dimethyl-2-(P-(3-t-butyl-4-hydroxy-5-methyl-phenyl)-propyonyl-oxy)-ethyl)-2,4,8,10-tetraoxospiro-Ethylenebis (oxyethylene) bis (3-t-butyl-4-hydroxy-5-methylhydrocinnamate), hexamethylenebis (3,5-di-t-butyl-4-hydroxycinnamate)-benzenepropanamide, N,N'-1,3-propanediylbis[3,5-bis(1,1-dimethylethyl)-4-hydroxy-], Calcium bis[monoethyl(3,5-di-t-butyl-4-hydroxybenzyl) phosphonate], Phenol, 2,2'-methylenebis[4-methyl-6-nonyl-], 1,1,3-Tris(2-methyl-4-hydroxy-5-t-butyl phenyl) butane, Phenol, 4,4'4'41-[(2,4,6-trimethyl-1,3,5-benzenetriyl)-tris-(methylene)]-tris-2,6-bis(1,1-dimethylethyl)-Bis-[3,3-bis-(4 -hydroxy-3-t-butylphenyl butanoic acid]-glycol ester, Tris(3,5-di-t-butyl-4-hydroxy benzyl) isocyanurate, 1,3,5-Tris (4-t-butyl-3-hydroxy-2,6-d imethylbenzyl)-1,3,5-triazine-2, 4,6-(1H,3H, 5H)-trione, 3-(3,5-Di-t-butyl-4-hydroxy-phenyl) propion acid ester with 1,3,5-tris (2-hydroxyethyl)-iso-cyanurate, Tetrakis [methylene (3,5-di-t-butyl-4-hydroxyhydrocinnamate)] methane, p-Cresol/dicyclopentadiene butylated reaction product, 1,1, 3-tris[2-methyl-4-[3-(3,5-di-tert-butyl-4-hydroxyphenyl) propionyloxy]-5-tertbutylphenyl] Butane.

Secondary anti-oxidants are for example trivalent phosphorous containing anti-oxidants and thio-ether containing anti-oxidants. Examples of trivalent phosphorous containing compounds are Trisnonylphenyl phosphite, Trilauryl phosphite, Tris (2,4-di-t-butylphenyl) phosphite, Di-Isooctylphosphite, Triisodecyl phosphite, Diisodecylphenylphosphite, Diphenyl isodecyl phosphite, Triphenyl phosphite, tris(tridecyl)phosphite, Diphenyl isooctyl phosphite, 12H-Dibenzo[d,g][1,3,2]dioxaphosphocin, 2,4,8,10-tetrakis(1,1-dimethylethyl)-6-(octyloxy)-2,2'-Ethylidenebis (4,6-di-t-butylphenyl) fluorophosphonite, Di-sodium-hydrogen-phosphite, Phosphorous acid, bis[2,4-bis(1,1-dimethylethyl)-6-methylphenyl] ethyl ester 2,4,6 Tri-t-butylphenyl-2-butyl-2-ethyl-1,3-propane-diol-phosphite, Triisooctyl phosphite Tris (dipropyleneglycol) phosphite, Diisooctyl octylphenyl phosphite, Tris-(2,4-di-tert.butyl-5-methylphenyl)-phosphite, (phenylethyl)phenylphosphites, iphenylphosphite, Phenylneopentyleneglycolphosphite, Phosphorous acid, trioctadecyl ester, Phosphorous acid, dinonylphenyl bis(nonylphenyl) ester, Phosphorous acid, 2-ethylhexyl diphenyl ester, 9,10-Dihydro-9-oxa-10-phosphaphenanthren-10-oxide Diphenyl Tridecyl Phosphite, Phosphonic acid, dioctyl ester, Phosphorous acid, 2-ethylhexyl diphenyl ester, Bis(octadecyloxy)-2,4,8,10-tetraoxa-3,9-diphosphaspiro[5.5]undecane, Tetrakis-(2,4-di-tert-butyl-phenyl)-4,4'-bi-phenylene-di-phosphonite, Bis (2,4-di-t-butylphenyl) pentaerythritol diphosphate, Bis-(2,6-di-tbutyl-4-methyl-phenyl)-pentaerythritol-di-phosphite, 2,4,8,10-Tetraoxa-3,9-diphosphaspiro[5.5]undecane, 3,9-bis[2,4,6-tris(1,1-dimethylethyl)phenoxy]-, Poly 4,4' isopropylidenediphenol C12-15 Alcohol phosphite, Tetrakis isodecyl 4,4'-isopropylidene diphosphite, Bis-(2,4-dicumylphenyl)-pentaerytritol-diphosphite, Phosphorous acid, (1-methylethylidene)di-4,1-phenylene-tetraoctadecyl ester, Phosphorous acid, oxybis (methyl-2,1 ethane diyl) tetraphenyl ester, Diisodecyl pentaerythritol diphosphate.

Examples of thio-ether containing compounds are Dilauryl thiodipropionate, Dimyristyl thiodipropionate, Distearyl thiodipropionate, Ditridecyl thiodipropionate, 3,3-Thiodipropionic acid used as monomer in the polymerization, Lauryl-stearylthiodiprionate, Disulfide, dioctadecyl Cyclohexane, 1-(octadecylthio)-3-[2-(octadecylthio)ethyl]-Propanoic acid, 3-(dodecylthio)-, 1,1'-[oxybis(2,1-ethanediyloxy-2,1-ethanediyl)] ester Pentaerythrityl tetrakis ([3-laurylthiopropionate), Bis[2-methyl-4-{3-n-alkyl(C12 or C14) thiopropionyloxy}-5-t-butylphenyl]sulphide, Propanoic acid, 3,3'-thiobis-, 1,1'-dimethyl ester, polymer with 1,4cyclohexanedimethanol, octadecyl ester, 2,4,8,10-Tetraoxa-3,9-diphosphaspiro[5.5]undecane, 3,9-bis[2-(1,1-dimethylethyl)-4-(1-methyl-1-phenylethyl)phenoxy]-Tetra (tridecyl)-4,4'-butylidene-bis(6-t-butyl-2-methyldiphenol) diphosphate, Phosphonous acid, [1,1'-biphenyl]-3,3'-diylbis-, tetrakis[2,4-bis(1,1-dimethylethyl)-5-methylphenyl] ester, poly(dipropyleneglycol) phenylphosphite, 2,4,8,10-Tetraoxa-3,9-diphosphaspiro [5.5]undecane,3,9-bis(nonylphenoxy)-2-[[2,4,8,10-Tetrakis (1,1-dimethylethyl)dibenzo[d,f][1,3,2]dioxaphosphepin-6-yl]oxy]-N,N-bis[2[[2,4,8,10-tetrakis( 1,1-dimethylethyl) dibenzo[d,f][1,3,2]dioxaphosphepin-6-yl]oxy-ethyl] ethanamine 3,6,8,11,14,16,19,22,24,27-Decaoxa-7,15,23-triphosphanonacosane-1,29-diol Phosphorous acid, P,P',P"-[(1-methyl-1-propanyl-3-ylidene)tris[2-(1,1-dimethylethyl)-5-methyl-4,1-phenylene]] P,P,P',P',P",P"-hexatridecyl ester, Trilauryl trithiophosphite UV-absorbers are compound that absorbs UV-light and transforms it into for the polymer less harmful energy.

Examples of UV-absorbers are pigments like for example carbon black, titanium dioxide, zinc oxide and organic chemical compounds.

Examples of organic UV-absorbers are hydoxybenzophenones, hydroxybenzotriazoles, triazines, anilides, benzoates, cyanoacrylates and phenylformamidines.

Examples of hydoxybenzophenones include 2-hydroxy-4-noctoxybenzophenone, 2-hydroxy-4-methoxybenzophenone, 2-propenoic acid, 2-(4-benzoyl-3-hydroxyphenoxy) ethyl ester, 2-hydroxy-4-n-dodecyloxy-benzophenone Poly-4-(2-acryloyloxyethoxy)-2 hydroxybenzophenone, bis-(2-methoxy-4-hydroxy-5-benzoylphenyl)-methane and [2-hydroxy-4-(2-hydroxyethoxy) phenyl] phenyl-methanone.

Examples of hydroxybenzotriazoles include 2-(2'-Hydroxy-3', 5'-di-tbutyl-phenyl)-benzotriazole, 2-(2 -hydroxy-3 -t-butyl-5 -methylphenyl)-5-chlorobenzotriazole, 2-(5-chloro-2H-benzotriazol-2-yl)-4,6-bis-(1,1-dimethylethyl)-phenol, 2-(2 -hydroxy-3,5-di-t-amylphenyl) benzotriazole, 2-(2H-benzotriazol-2-yl)-4-methyl-phenol, 2-(2H-benzotriazol-2-yl)-4-(1,1-dimethylethyl)-phenol, 2-(2H-benzotriazol-2-yl)-4-(1,1,3,3-tetramethylbutyl)-phenol, 3-(2H-benzotriazole-2-yl)-5-(1,1-dimethylethyl)-4-hydroxy-1,6-hexanediylester of benzene propanoic acid, bis[2-hydroxy-5-t-octyl-3-(benzotriazol-2-yl)phenyl]methane, 2-[2-hydroxy-3,5-di(1,1-dimethylbenzyl)phenyl]2Hbenzotriazole, bis[2-hydroxy-5-methyl-3-(benzotriazol-2-yl)phenyl]methane, 2-(2Hbenzotriazol-2-yl)-4-(1, 1-dimethylethyl)-6-(2-methylpropyl)-phenol, 2-(2H-benzotriazole-2-yl)-4-methyl-6-dodecyl phenol, reaction product of P-[-3-(2-H-Benzotriazol-2-yl)-4-hydroxy-5-tert.butylphenyl]-propionic acid-methyl ester and polyethyleneglycol 300, 3-(2H-benzotriazol-2-yl)-5-(1,1-dimethylethyl)-4-hydroxy-benzenepropanoic acid, 2-(2Hbenzotriazol-2-yl)-6-(1 -methyl-1-phenylethyl)4-(1,1,3,3-tetramethylbutyl)phenol, 2-(2'-hydroxy-5'-(2-hydroxyethyl))-benzotriazole, 2-(2-hydroxy-4-octyloxyphenyl)-2H benzotriazole, 2-[4-[4,6-bis ([1,1'-biphenyl]-4-yl)-1,3,5-triazin-2-yl]-3-hydroxyphenoxy]-propanoic acid isooctyl ester, octyl-3-[3-tert-butyl-4-hydroxy-5-(5-chloro-2Hbenzotriazole-2-yl)fenyl] propionaat +2-, ethylhexyl-3-[3-tertbutyl-4-hydroxy-5-(5-chloro-2H-benzotriazole-2yl)fenyl]propionaat and 2-(2H-benzotriazol-2-yl)-6-[[3-(1,1-dimethylethyl)-2-hydroxy-5-methylphenyl]methyl]-4-(1, 1,3,3-tetramethylbutyl)-phenol. Examples of triazines include 2-[4,6-diphenyl-1,3,5-triazin-2-yl]-5-(hexyl)oxy-phenol, 2-[4,6-bis(2, 4-dimethylphenyl)-1,3,5-triazin-2-yl]-5-(octyloxy)-phenol, 2-[4[(2-hydroxy-3-(2'-ethyphexyl)oxy]-2-hydroxyphenyl]-4,6-bis(2, 4-dimethylphenyl)-1,3,5-triazine, 2,4-bis[2-hydroxy-4-butoxyphenyl]-6-(2,4-dibutoxyphenyl)-1,3,5-triazine, 5,5'-bis(2-ethylhexyloxy)-2,2'-[6-(4-methoxyphenyl)-1,3,5-triazine-2,4-diyl]diphenol and a mixture of: 2-[4-[(2-Hydroxy-3-dodecyloxypropyl)oxy]-2-hydroxyphenyl]-4,6-bis(2,4-dimethylphenyl)-1,3,5-triazine and 2-[4-[(2-Hydroxy-3-tridecyloxypropyl) oxy]-2-5 hydroxyphenyl]-4, 6-bis(2,4-dimethylphenyl)-1,3,5-triazine in 1-methoxy-2-propylacetate.

Examples of anilides include 2-ethoxy-5-t-butyl-2'-ethyl-oxalanilide, 2-ethyl, 2-ethoxy-oxalanilide and N-(2-ethoxy-phenyl)-N'-(4-iso-dodecyl-phenyl)-ethanediamine.

Examples of benzoates include 3,5-di-t-butyl-4-hydroxybenzoic acid, n-hexadecyl ester, 4-t-butyl-phenyl-salicylate, benzoic acid, 3,5-bis (1, 1-dimethylethyl)-4-hydroxy-, 2,4-bis (1,1-dimethylethyl) phenyl ester and benzoic acid, 2-hydroxy-, phenylester. Examples of cyanoacrylates include ethyl 2-cyano-3, 3-15 diphenylacrylate 2-Ethylhexyl 2-cyano-3,3-diphenylacrylate and 1,3-bis-[2'-cyano-3',3-d iphenylacryloyl)oxy]-2,2-bis-([2-cyano 3',3"diphenylacryloyl)oxy]methyl)propane. Examples of phenylformamidines include the ethyl ester of 4-[[(methylphenylamino) methylene] amino]-benzoic acid and 20 N-(p-Ethoxy-carbonylphenyl)-N -ethyl-N-phenylformamidine.

Further examples of UV-absorbers include 3-(4-methoxyphenyl)-, 2-ethylhexyl ester of 2-propenoic acid, [(4- methoxyphenyl)-methylene]-dimethyl ester of Propanedioic acid, tetra-ethyl-2,2'-(1,4-phenylene-dimethylidene)-bismalonate, 1,4-bis(4-benzoyl-3-hydroxyphenoxy)-butane and 2.2 -(1,4-phenylene) bis[4H-3, 1-25 benzoxazin-4-one].

Examples of HALS compounds include those of the following general formulas or combinations thereof;

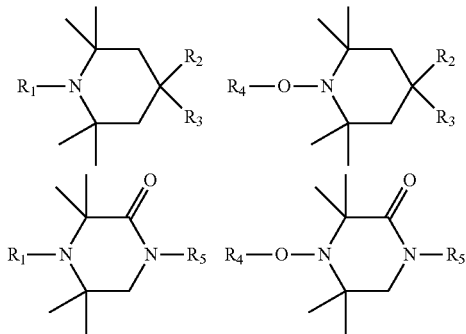

wherein $R_1$ up to and including $R_5$ are independent substituents; for example, containing hydrogen, ether, ester, amine, amide, alkyl, alkenyl, alkynyl, aralkyl, cycloalkyl and/or aryl groups, which substituents may in turn contain functional groups, for example alcohols, ketones, anhydrides, imines, siloxanes, ethers, carboxyl groups, aldehydes, esters, amides, imides, amines, nitriles, ethers, urethanes and any combination thereof.

Preferably the HALS is a compound derived from a substituted piperidine compound, in particular any compound which is derived from an alkylsubtituted piperidyl, piperidinyl or piperazinone compound or a substituted alkoxypiperidinyl. Other suitable HALS are those that are derivatives of 2,2, 6,6-tetramethyl piperidine. Preferred specific examples of HALS include:

~2,2, 6,6-tetramethyl-4-piperidinone
~2,2, 6,6-tetramethyl-4-piperidinol
~bis-(2, 2, 6,6-tetramethyl-4-piperidinyl)-sebacate (Tinuvin 770)
~mixtures of esters of 2,2,6,6-tetramethyl-4-piperidinol and fatty acids (Cyasorb UV 3853)
~bis-(2,2,6,6-tetramethyl-4-piperidinyl)-succinate (Tinuvin 780)
~bis-(1-octyloxy-2,2,6,6-tetramethyl-4-piperidinyl)-sebacate (Tinuvin 123)
~bis-(1,2,2,6,6-pentamethyl-4-piperidinyl)-sebacate (Tinuvin 765)
~tetrakis-(2,2,6,6-tetramethyl-4-piperidyl)-1,2,3,4-butane-tetracarboxylate
~N-butyl-2,2,6,6-tetramethyl-4-piperidinamine
~N,N'-bis-(2,2,6,6-tetramethyl-4-piperidyl)-hexane-1,6-diamine
~2.2'-[(2.2.6.6-tetramethyl-4-piperidinyl)-imino]-bis-[ethanol]
~5-(2.2.6.6-tetramethyl-4-piperidinyl)-2-cyclo-undecyl-oxazole) (Hostavin N20)
~mixture of: 2,2,4,4 tetramethyl-21-oxo-7-oxa-3.20-diazadispiro [5.1.11.2] heneicosane-20-propionic acid dodecylester and 2.2.4.4 tetramethyl-21-oxo-7; oxa-3, 20-diazadispiro [5,1,11,2]-heneicosane-20-propionic acid; tetradecyl ester (Hostavin N24)
~diacetam 5 (CAS registration number: 76505-58-3)
~propanedioic acid, [(4-methoxyphenyl) methylene]-, bis (1,2,2,6,6-pentamethyl-4-piperidinyl) ester (Sanduvor PR 31)
~1,3-benzendicarboxamide, N,N'-bis (2,2,6,6-tetramethyl-4-piperidinyl) (Nylostab S-EED)
~3-dodecyl-1-(2,2,6,6-tetramethyl-4-piperidyl)-pyrrolidin-2,5-dione (Cyasorb UV3581)
~formamide, N,N'-1,6-hexanediylbis [N-(2,2,6,6-tetramethyl-4-piperidinyl (Uvinul 4050H)
~3-dodecyl-1-(1,2,2, 6,6-pentamethyl-4-piperidyl)-pyrrolidin-2,5-dione (Cyasorb UV-3641)
~1,5-Dioxaspiro (5,5) undecane 3,3-dicarboxylic acid, bis (2,2,6,6-tetramethyl-4-peridinyl) ester (Cyasorb UV-500)
~1,5-Dioxaspiro (5,5) undecane 3,3-dicarboxylic acid, bis (1,2,2,6,6-pentamethyl-4-peridinyl) ester (Cyasorb UV-516)
~bis (1,2,2,6,6-penta methyl-4-pi peridinyl)(3,5-di-t-butyl-4-hydroxybenzyl)-butylpropanedioate (Tinuvin 144)
~tetrakis-(1,2,2,6,6-penta-methyl-4-piperidyl)-1,2,3,4-butane-tetra-carboxylate (ADK STAB LA-52)
~1,2,3,4-butanetetracarboxylic acid, tetrakis(2,2,6,6-tetramethyl-4-piperidinyl) ester (ADK STAB LA-57)
~1,2,3,4-butane-tetracarboxylic acid-1,2,3-tris (1,2,2,6,6-pentamethyl-4-piperidinyl)-4-tridecylester (ADK STAB LA-62)
~8-acetyl-3-dodecyl-7,7,9,9-tetra methyl-1,3,8-triazaspiro (4,5) decane-2,4-dione (Tinuvin 440)
~N-2,2,6,6-tetrametyl-4-piperidinyl-N-amino-oxamide (Luchem HAR100)
~4-acryloyloxy-1,2,2,6,6-pentamethyl-4-piperidine
~1,5,8,12-tetrakis [2',4'-bis (1'',2'',2'',6'',6''-pentamethyl-4''-piperidinyl(butyl)amino)-1',3',5'-triazin-6'-yl]-1,5,8, 12-tetraazadodecane
~1,1'-(1,2-ethane-di-yl)-bis-(3,3', 5,5'-tetra-methyl-piperazinone) (Good rite 3034)
~propane amide, 2-methyl-N-(2,2,6,6-tetramethyl-4-piperidinyl)-2-[(2,2,6,6-tetramethyl-4-piperidinyl)amino] (Sumisorb TM-061)
~oligomer of N-(2-hydroxyethyl)-2,2,6,6-tetramethyl-4-piperidinol and succinic acid (Tinuvin 622)
poly [[6-[(1,1,3,3-tetramethylbutyl)amino]-s-triazine-2,4-diyl][2,2,6,6-tetramethyl-4-piperidinyl)imino] hexamethylene [(2,2,6,6-tetramethyl-4-piperidinyl)imino]] (Chimassorb 944)
~poly [(6-morfoline-S-triazine-2.4-diyl) [(2.2.6.6-tetramethyl-4-piperidinyl)-imino]hexamethylene-[(2.2.6.6-tetramethyl-4-piperidinyl)-imino]] (Cyasorb UV-3346)
~poly [(6-morpholino-s-triazine-2.4-diyl) [1.2.2.6.6-penta-methyl-4-piperidyl) imino]-hexamethylene [(2,2, 6,6 tetra-methyl-4-piperidyl) imino]] (Cyasorb UV-3529)
~poly methylpropyl-3-oxy-[4(2.2.6.6-tetrametyl)-piperidinyl)]-siloxane copolymer of a-methylstyrene and n-(2.2.6.6-tetramethyl-piperidinyl)-4-maleimide and N-stearyl-maleimide
~1,2,3,4-butane tetracarboxylic acid, polymer with 8,8,8',8'-tetramethyl-2,4,8,10-tetraoxaspiro [5,5] undecane-3, 9-diethanol, 1,2,2, 6,6-pentamethyl-4-piperidinyl ester (Mark LA63)
~1,2, 3,4-butanetetracarboxylic acid, polymer with 8,8,8', 8'-tetramethyl-2,4,8,10-tetraoxaspiro [5,5] undecane-3, 9-diethanol, 2,2,6,6-tetramethyl-4-piperidinyl ester (Mark LA68)
~oligomer of 7-Oxa-3,20-diazadispiro [5,1,11,2] heneicosan-21-one, 2,2,4,4-tetramethyl-20-(oxiranylmethyl) (Hostavin N30)
~1,3,5-Triazine-2,4,6-triamine, N, N'''-[1,2-ethanediylbis [[[4,6-bis[butyl(1,2,2,6,6-pentamethyl-4-iperidinyl)

amino]-1,3,5-triazine-2-yl]imino]-3,1- propanediyl]]-bis [N. N"-dibutyl-N. N"-bis (1.2.2.6.6-pentamethyl-4-piperidinyl) (Chimassorb119)

~1.3-Propanediamine, N, N-1,2-ethanediylbis-, polymer with 2,4,6-trichloro-1,3,5-triazine, reaction products with N-butyl-2,2,6,6-tetramethyl-4-piperidinamine (Uvasorb HA88)

~1.6-Hexanediamine, N,N'-bis (2,2,6,6-tetramethyl-4piperidinyl)-polymer with 2,4,6-trichloro-1,3,5-triazine, reaction products with N-butyl-1-butanamine and N-butyl-2,2,6,6-tetramethyl-4-piperidinamine (Chimassorb 2020)

~2,9,11,13,15,22,24,26,27,28-Decaazatricyclo [21,3,1,110,14]octacosa-1(27), 10,12,14(28),23,25-hexaene-12, 25-diamine, N,N'-bis (1,1,3,3-tetramethylbutyl)-2, 9,15,22-tetrakis (2,2,6,6-tetramethyl-4-piperidinyl)-(Chimassorb 966)

~1,1,1"-(1,3,5-Triazine-2,4,6-triyltris ((cyclohexylimino)-2,1-ethanediyl) tris (3,3,5,5-tetramethylpiperazinone) (Goodrite 3150)

~1,1,1"-(1,3,5-Triazine-2,4,6-triyltris((cyclohexylimino)-2,1-ethanediyl) tris (3,3,4,5,5-tetramethylpiperazinone) (Goodrite 3159)

~1,6-hexanediamine, N, N'-bis (2,2,6,6-tetramethyl -4-piperidinyl)-, polymer with 2,4,6-trichloro-1,3,5-triazine, reaction products with 3-bromo-1-propene, nbutyl-1-butanamine and N-butyl-2,2,6,6-tetramethyl-4-piperidinamine, oxidised, hydrogenated (Tinuvin NOR 371)

~Alkenes, (C20-24)-4 alpha-, polymers with maleic anhydride, reaction products with 2,2,6,6-tetramethyl-4-piperidinamine (Uvinul 5050H)

~N-2,2,6,6-tetramethyl-4-piperidinyl-N-amino-oxamide; 4-acryloyloxy-1,2,2,6,6-pentamethyl-4-piperidine; HALS PB-41 (Clariant Huningue S.A.).

Examples of hydrolysis stabilizers are compounds having di- and/or multiple functional groups incorporating isocyanate, carbodiimide, oxazoline, epoxy, anhydride or lactam groups and mixtures. Preferably compounds having di- and/or multiple functional groups incorporating epoxy, caprolactam or oxazoline are used as hydrolysis stabilizers. Preferred hydrolysis stabilizers are 2,3-epoxypropyl methacrylate (Joncryl® ADR 4400), carbonyl bis caprolactam or 1,3-Bis(4,5-dihydro-2-oxazolyl) benzene) (Nexamite® A99). In the present invention it has been found that the presence of these hydrolysis stabilizers in the weatherable layer, show a decrease in yellowing.

When durability enlarging additives are present, the layer may comprise from 0.05-10 wt. % additives and more preferably from 1-5 wt. % additives, based on the total weight of the polymers in the layer.

White pigments such as TiO2, ZnO or ZnS may be added to the functional layer to increase backscattering of sunlight leading to increased efficiency of the solar module. Black pigments such as carbon black may also be added for esthetic reasons.

When inorganic fillers are present, a layer may comprise from 2-25 wt. % fillers and more preferably from 5-20 wt. % fillers, based on the total weight of the polymers in the layer.

In the back-sheet according to the present invention the weatherable layer preferably comprises impact modified polybutylene terephthalate and the structural layer comprises polyolefin. In this case the polyolefin is preferably a polypropylene homo-or copolymer optionally functionalized with maleic anhydride.

In the back-sheet according to the present invention the weatherable layer may also comprise the polyolefin and the structural layer may comprise the impact modified polybutylene terephthalate. The polyolefin is than preferably a polypropylene homo-or copolymer optionally functionalized with maleic anhydride. In case that the weatherable layer comprises a polyolefin, then the thickness of the polyolefin layer is preferably above 50 μm, more preferably above 75 μm, most preferably between 80 and 100 μm.

The present invention also relates to a process for the manufacturing of the back-sheet according to the present invention. The back-sheet according to the present invention may be prepared using a multi-layer fusion/or co-extrusion. The process therefore comprises the steps of compounding of the individual formulations of the functional layer, the structural layer, weatherable layer and/or adhesive layer including inorganic fillers, additives and stabilizers followed by extrusion of the different layers and laminating them.

Also possible is that the back-sheet is obtained by melt co-extruding of the different layers in the back-sheet via the following steps: (1) preparing the polymer compositions of the different layers by separately mixing the components of the different layers, (2) melting of the different polymer compositions to obtain different melt streams, (3) combining the melt streams by co-extrusion in one extrusion die, (4) cooling the co-extruded layer.

The present invention further relates to a photovoltaic module comprising the back-sheet according to the present invention. A photovoltaic module (abbreviated PV module) comprises at least the following layers in order of position from the front sun-facing side to the back non-sun-facing side: (1) a transparent pane (representing the front sheet), (2) a front encapsulant layer, (3) a solar cell layer, (4) a back encapsulant layer, and (5) the back-sheet according to the present invention, representing the rear protective layer of the module.

The front sheet is typically a glass plate.

The front and back encapsulant used in solar cell modules are designed to encapsulate and protect the fragile solar cells. The "front side" corresponds to a side of the photovoltaic cell irradiated with light, i.e. the light-receiving side, whereas the term "backside" corresponds to the reverse side of the light-receiving side of the photovoltaic cells. Suitable encapsulants typically possess a combination of characteristics such as high impact resistance, high penetration resistance, good ultraviolet (UV) light resistance, good long-term thermal stability, adequate adhesion strength to glass and/or other rigid polymeric sheets, high moisture resistance, and good long-term weather ability. Currently, ethylene/vinyl acetate copolymers are the most widely used encapsulants.

The solar cells in the solar cell layer may be any kind of solar cells, such as thin-film solar cells (for example copper indium gallium selenide solar cells and cadmium telluride solar cells), wafer-based solar cells, a silicon solar cell, a monocrystalline solar cell or a polycrystalline solar cell.

The photovoltaic module comprising the back-sheet according to the present invention surprisingly provides more hydrolytic and UV stability, and corrosion resistance which results in increased durability and as such to a reduced power output decay upon lifetime.

The present invention will now be described in detail with reference to the following non-limiting examples which are by way of illustration.

EXAMPLES

TABLE 1

Sample information

| Sample | Weatherable layer [thickness in μm] | Tie layer [thickness in μm] | Structural layer [thickness in μm] | Tie [thickness in μm] | Functional layer [thickness in μm] | Total [thickness in μm] |
|---|---|---|---|---|---|---|
| 1 | IMPBT [20] | EMA [25] | (PP) [200] | EMA [25] | (PE) [30] | 300 |
| 2 | IMPBT [50] | EMA [25] | (PP) [170] | EMA [25] | (PE) [30] | 300 |
| 3 | (PP) [120] | EMA [25] | IMPBT [100] | EMA [25] | (PE) [30] | 300 |

IMPBT = impact modifier PE-MAH (20 wt % based on total weight of the PBT) + PBT + TiO2 + stabilizers;
Elvaloy 1224 = EMA = copolymer of ethylene and methylacrylate,
PE-MAH means polyethylene copolymer grafted with maleic acid anhydride (MAH)

Damp-heat ageing (DH) test were done in a Votsch climate chamber VC4200) at a temperature of 85° C. and a relative humidity of 85%.

Acetic Acid Concentration

Acetic acid concentration has been determined via ion chromatography with a Dionex ion chromatograph: -LC30 chromatography oven, ED40 electrochemical detector, GP40 gradient pump, Dionex ASAS 300 4 mm suppressor, Agilent 1200 autosampler.
Column: Dionex AG-11HC (50×4 mm)+Dionex AS-11 HC (250×4 mm)
Eluens: 1 mM KOH in milli-Q water, Flow: 1.2 ml/min, Injection volume: 50 μl,
Temperature: 30° C.
Calibration: solutions of acetic acid in milli-Q water, range 0-4 ppm.
Samples: samples are diluted with milli-Q water Example 1

In mini-modules, the acetic acid concentration has been analyzed after 2000 hrs. ageing in DH (85% RH/85° C.). Acetic acid has been determined by means of ion chromatography after an extraction with Milli-Q water at 100° C. for 12 hours. Pieces of the back-sheet are removed from the backside of the PV-module at places (1,2 & 3) depicted in FIG. 1.

Corresponding measured acetic acid concentrations are given in Table 2.

TABLE 2

Acetic acid concentration

| Sample | IMPBT Thickness μm | AA conc-spot 1 Concentration [ppm] | AA conc-spot 2 Concentration [ppm] |
|---|---|---|---|
| 1 | 20 | 59 | 512 |
| 2 | 50 | 80 | 355 |
| 3 | 100 | 56 | 241 |

As shown in table 2 there is a decrease in acedic acid concentration in case the weatherable layer comprises IMPBT. It is moreover clear that the acetic acid concentration decreases further with an increase of IMPBT layer thickness (compare 20 μm to 50 μm). Sample 3 shows the acetic acid concentration in case the structural layer comprises IMPBT.

Example 2

Acetic Acid Transmission Rate (AATR)

Figure 2:
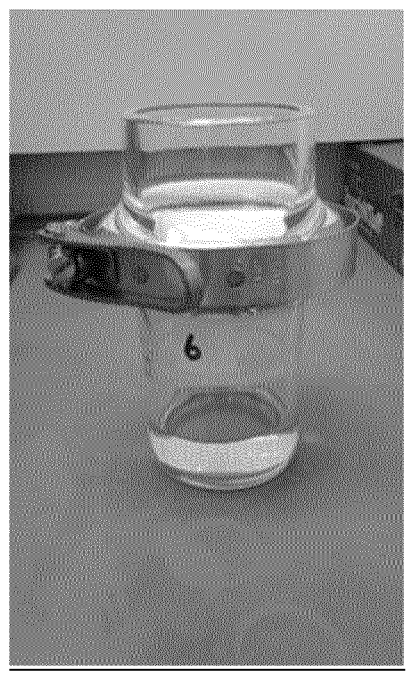
FIG. 2 is a photograp lowing a laboratory setup for conducting acetic acid transmission rate (AATR) measurements according to Example 2.

AATR measurements are conducted using a set-up shown in FIG. 2. This is referred to as the "upright cup" in which in the bottom is acetic acid liquid (50 ml). An air gap of 7 cm is in between the acetic acid and the investigated polymer film which is clamped in between 2 glass parts. The surface area of the polymer film is 30.37 cm². The mass decrease/increase is followed in time. Temperature and relative humidity in which the measurements are executed is ±21° C. and ±50% R.H.

Results are given in table 3.

TABLE 3

| Sample | Film thickness [μm] | AATR-1 [g/(m² · day)] | AATR-2 [g/(m² · day)] |
|---|---|---|---|
| monolayer PBT/stab/TiO2 | 113 | 6.5 | 6.2 |
| monolayer IMPBT/stab/TiO2 | 115 | 13.3 | 13.2 |

From table 3 it is clear that a higher acetic acid transmission rate (AATR) is observed for a monolayer comprising IMPBT compared to a monolayer comprising PBT. It is assumed that a layer comprising IMPBT in a back-sheet will also provide a higher AATR. This results in less module power loss during DH-ageing.

Example 3

Thermal Stability of Monolayer PBT vs IMPBT

For testing the thermal stability of the monolayer pieces of PBT and IMPBT film are cut into rectangular shapes of approx. 8×6 cm and put in a preheated air-oven at 200° C. After different time intervals a sample is taken out and the appearance is judged visually, mechanical performance is judged manually. Results are given in table 4.

TABLE 4

Figure 3:
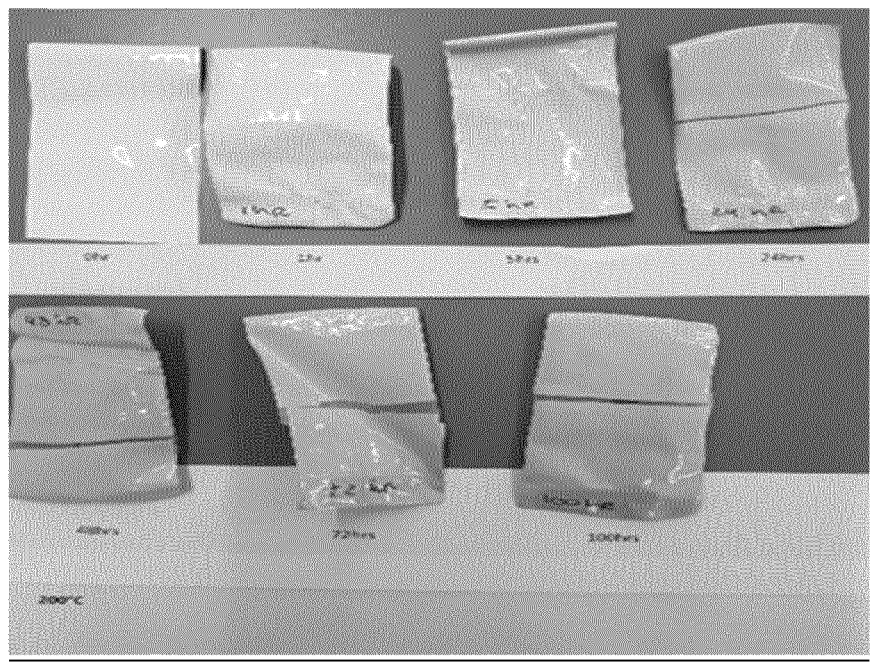
FIGS. 3 and 4 are photographs showing the visible thermal stability results of the PBT and IMPBT monolayer test pieces, respectively, that were tested according to Example 3.
Figure 4:
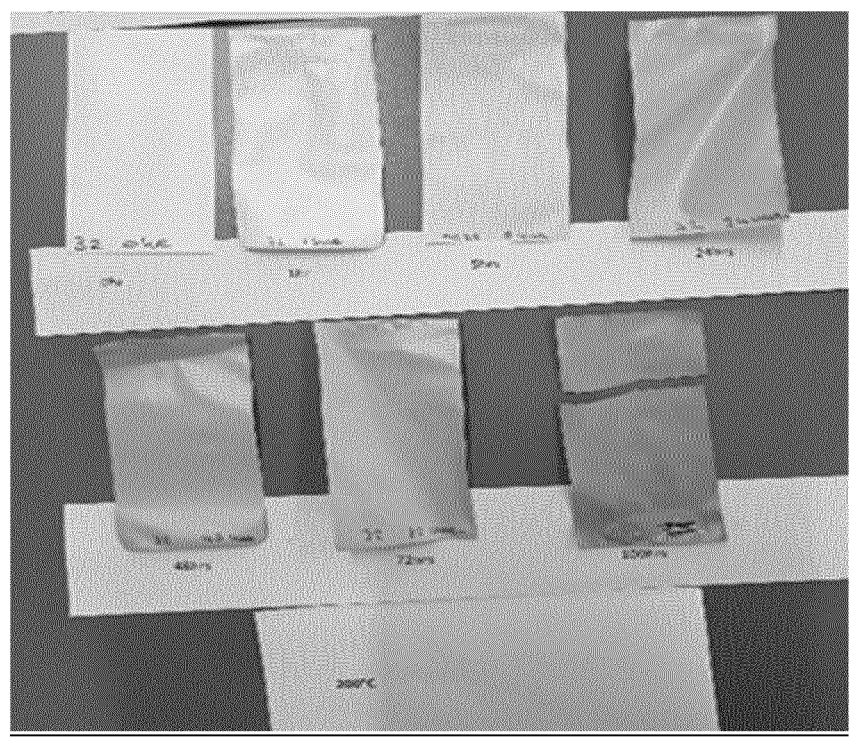

| Sample (mono-layer of 100 μm thickness) | Brittleness observed between [hrs] | FIG. |
|---|---|---|
| PBT/TiO2/stabilizers | 5-24 | FIG. 3 |
| IMPBT/TiO2/Stabilizers | 72-100 | FIG. 4 |

It is clear from the oven test results that IMPBT results in much better heat stability performance. The use of IMPBT in a back-sheet will thus provide a better thermal stability.

Example 4

Hydrolysis Stability of IMPBT Monolayer

Impact modified PBT compounds were made using a standard melt extrusion process (Compositions are given in table 4) using a strand granulation. These granulates were fed into the hopper of a single screw melt extruder to make films according to a standard film extrusion process with a thickness of 100 µm.

The produced single layer films were aged in a damp-heat chamber (Vötsch climate chamber VC4200) at a temperature of 85° C. and a relative humidity of 85%. After 1000 h the yellowness and mechanical properties were determined.

Color measurements were done using a Minolta CM3700d spectrophotometer using D65 as illuminant, d/8 geometry, 10° viewing angle, specular included and UV included. These measurements were done using a white calibration tile as background.

The change in YI was calculated according to ASTM E313-96.

Tensile properties were determined after drying the samples overnight (~60° C./N2-purge) using a Zwick/Roell tensile machine at a test speed of 50 mm/min. For the tensile measurements ISO 527 type 5A tensile bars were used and prepared before ageing.

Reported are the Elongation at break (Eab) retentions after 1000 h DH-ageing which is measure of the films hydrolytically stability.

TABLE 4

| Compositions Amounts in wt % | Comparative sample 1 (CS1) | 1 | 2 | 3 | 4 |
|---|---|---|---|---|---|
| PBT | 100 | 61 | 61.25 | 61.45 | 61.35 |
| IM | | 16 | 16 | 16 | 16 |
| TiO2 | | 20 | 20 | 20 | 20 |
| Chimassorb 2020 | | 0.5 | 0.5 | 0.5 | 0.5 |
| Tinuvin 770 | | 0.25 | 0.25 | 0.25 | 0.25 |
| Tinuvin 1577 | | 1 | 1 | 1 | 1 |
| Lankrolflex L | | 1.25 | | | |
| Joncryl ADR4400 | | | 1 | | |
| Nexamite A99 | | | | 0.8 | |
| Carbonyl bis caprolactam | | | | | 0.9 |
| Film thickness [µm] | 100 | 100 | 100 | 100 | 100 |
| δYI - DH1000 | 0.6 | 9.3 | 0.9 | 1.6 | 1.1 |
| Eab retention - DH1000 [%] | 2 | 80 | 80 | 90 | 100 |

Table 4 shows the need for a hydrolysis stabilizer as in its absence, 1000 h damp heat ageing results in a large decrease in Eab (CS1). Besides reducing the decrease in Eab yellowing should be limited too as is the case in examples 2-4.

The invention claimed is:

1. A back-sheet for a photovoltaic module comprising:
   a weatherable layer,
   a structural layer, and
   a functional layer, wherein
   a first one of the weatherable layer, the structural layer and the functional layer comprises an impact modified polybutylene terephthalate, and
   a second and/or third one of the weatherable layer, the structural layer and the functional layer comprises a polyolefin, wherein
   the impact modified polybutylene terephthalate comprises an impact modifier which includes an elastomer containing functional groups that bond chemically and/or interact physically with the impact modified polybutylene terephthalate, and wherein
   the elastomer constitutes a dispersed phase at a concentration of 1-49 Vol %.

2. The back-sheet according to claim 1, wherein the functional groups are selected from the group consisting of anhydrides, acids, epoxides, silanes, isocyanates, oxazolines, thiols and (meth)acrylates.

3. The back-sheet according to claim 1, wherein the functional groups are epoxides.

4. The back-sheet according to claim 1, wherein the polyolefin is selected from the group consisting of optionally functionalized polyethylene homo or copolymers, optionally functionalized polypropylene homo or (block-)copolymers, cyclic olefin copolymers, polymethyl pentene, a thermoplastic polyolefin (TPO) and blends thereof.

5. The back-sheet according to claim 4, wherein the polyolefin is a polypropylene homo or (block-)copolymer.

6. The back-sheet according to claim 1, wherein the weatherable layer comprises the impact modified polybutylene terephthalate and the structural layer comprises the polyolefin.

7. The back-sheet according to claim 1, wherein the weatherable layer comprises the polyolefin and the structural layer comprises the impact modified polybutylene terephthalate.

8. The back-sheet according to claim 1, wherein the functional layer comprises the polyolefin or a blend comprising the polyolefin.

9. The back-sheet according to claim 8, wherein the polyolefin comprises a functionalized polyolefin.

10. The back-sheet according to claim 8, wherein the polyolefin blend comprises a functionalized polyolefin and a high crystalline polymer with a melting point above 150° C.

11. The back-sheet according to claim 1, wherein the weatherable layer, the structural layer and/or the functional layer further comprise inorganic additives or durability enlarging additives selected from the group consisting of antioxidants, UV stabilizers, thermal stabilizers and hydrolysis stabilizers.

12. The back-sheet according to claim 11, wherein the weatherable layer comprises hydrolysis stabilizers selected from the group consisting of a 2,3-epoxypropyl methacrylate, carbonyl bis caprolactam and 1,3-Bis(4,5-dihydro-2-oxazolyl)benzene.

13. The photovoltaic module comprising the back-sheet according to claim 1.

14. The photovoltaic module comprising, in order of position from a front-sun facing side to a back non-sun-facing side:
- a transparent pane,
- a front encapsulant layer,
- a solar cell layer comprised of one or more electrically interconnected solar cells, and
- the back-sheet according to claim 1, wherein the back-sheet is connected to lower sides of the solar cells.

* * * * *